United States Patent
Anderson (12)

(10) Patent No.: US 6,349,121 B1
(45) Date of Patent: Feb. 19, 2002

(54) BASEBAND DATA SLICING METHOD AND APPARATUS

(75) Inventor: Jason R. Anderson, Neenah, WI (US)

(73) Assignee: MemoryLink, Inc., Neenah, WI (US)

( * ) Notice: Subject to any disclaimer, the term of this patent is extended or adjusted under 35 U.S.C. 154(b) by 0 days.

(21) Appl. No.: 09/525,789

(22) Filed: Mar. 15, 2000

(51) Int. Cl.$^7$ .............................................. H04L 25/06
(52) U.S. Cl. ...................... 375/317; 327/306; 327/307
(58) Field of Search .......................... 375/317; 327/306, 327/307

(56) References Cited

U.S. PATENT DOCUMENTS

| | | | | |
|---|---|---|---|---|
| 5,128,609 A | * | 7/1992 | Howley | 324/121 R |
| 5,499,230 A | * | 3/1996 | Yanagi | 369/44.28 |
| 5,587,681 A | * | 12/1996 | Fobbster | 327/307 |

* cited by examiner

*Primary Examiner*—Chi Pham
*Assistant Examiner*—Kevin M Burd
(74) *Attorney, Agent, or Firm*—Banner & Witcoff, Ltd.

(57) ABSTRACT

A DC-coupled data slicer operates on a baseband signal based on a variable threshold and an AC-coupled data slicer operates on the baseband signal based on a fixed threshold. The variable threshold is initially set to a stored threshold value corresponding to a previously used value of the variable threshold. Differences between DC-coupled sliced data and the AC-coupled sliced data are determined and used to adjust the variable threshold. In one embodiment, the AC-coupled data slicer is characterized by a settling time constant. The variable threshold is not adjusted until expiration of a predetermined delay preferably set to be a multiple of the settling time constant. After expiry of the predetermined delay, adjustments to the variable threshold are made to correct any detected variances in the expected duty cycle of the DC-coupled data slicer output. In this manner, the present invention overcomes the problems resulting from settling times inherent in prior art techniques.

38 Claims, 7 Drawing Sheets

BASEBAND DATA SLICING METHOD AND APPARATUS

TECHNICAL FIELD

The present invention relates generally to communication systems and, in particular, to a method and apparatus for performing baseband data slicing.

BACKGROUND OF THE INVENTION

Communications systems are well known in the art. In many such systems, information (e.g., voice or data information) to be conveyed from a transmitting communication unit to a receiving communication unit is represented as a baseband signal that, in turn, is used to modulate a carrier signal. At the receiving communication unit, a demodulation process is employed to extract the baseband signal from the carrier signal. Where the baseband signal is a representation of digital data, so-called data slicing is performed at the receiver in order to determine what binary digits have been received. In general, data slicing refers to the process whereby the recovered baseband signal is compared against a threshold to decide whether, for a given data period, a binary one or zero value has been sent. Various techniques for performing such baseband data slicing are known in the art.

Figure 2:
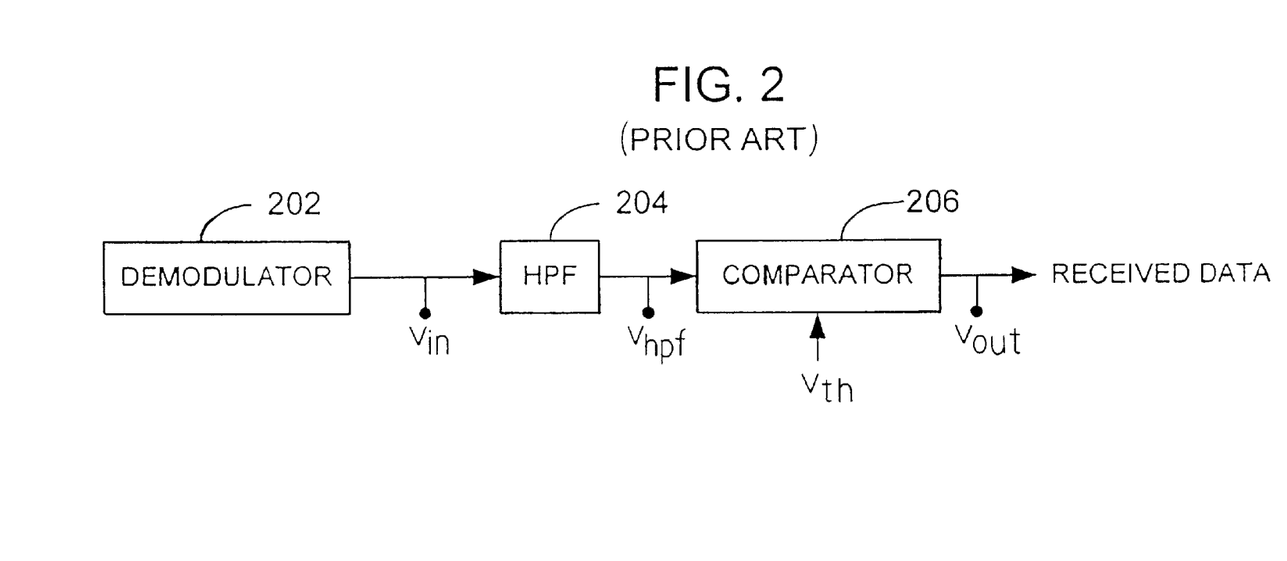
FIG. 2 is a block diagram of an apparatus for performing AC-coupled baseband data slicing in accordance with the prior art.
Figure 3:
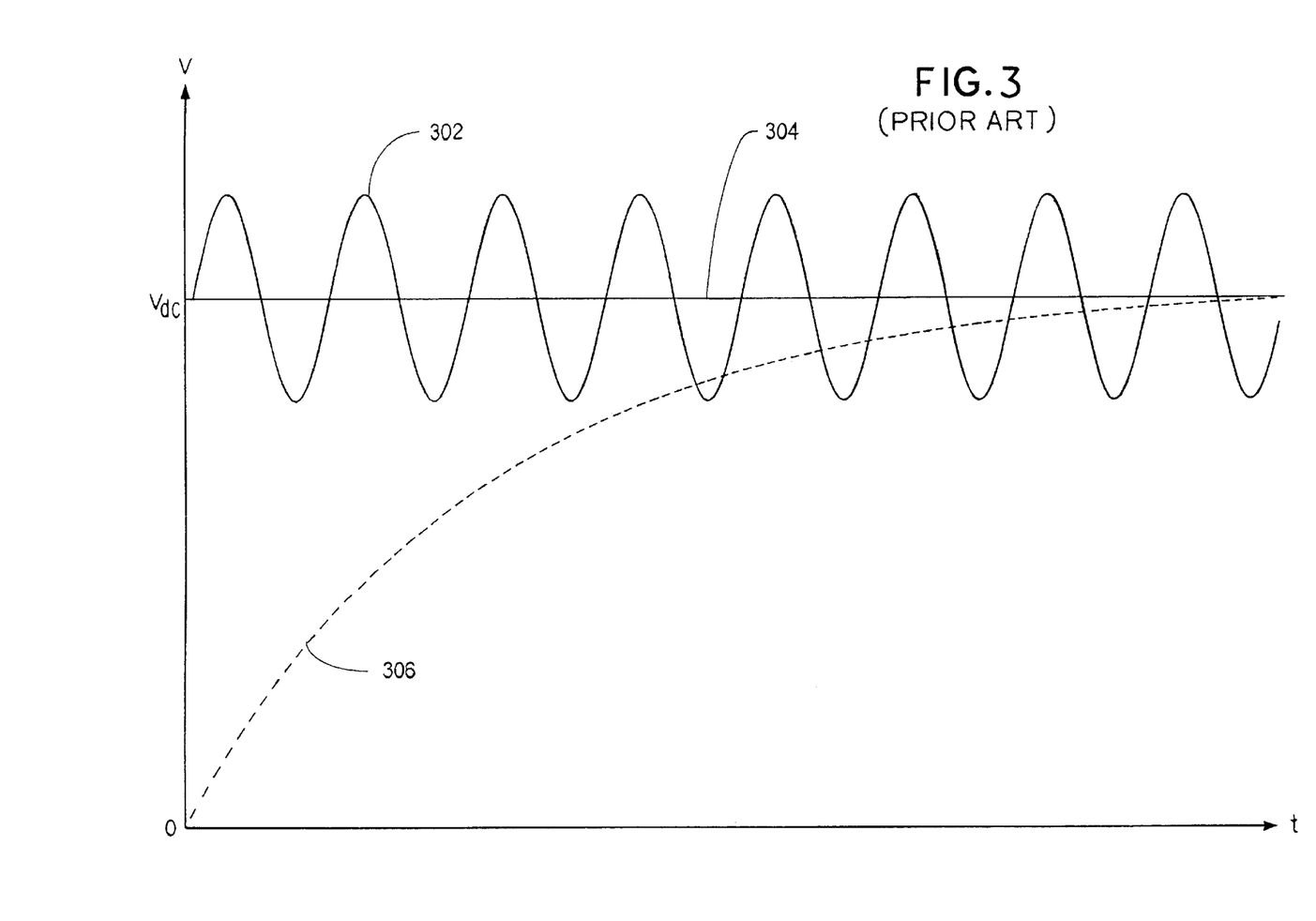
FIGS. 3–5 illustrate exemplary waveforms occurring in prior art AC- and DC-coupled baseband data slicing systems.
Figure 4:
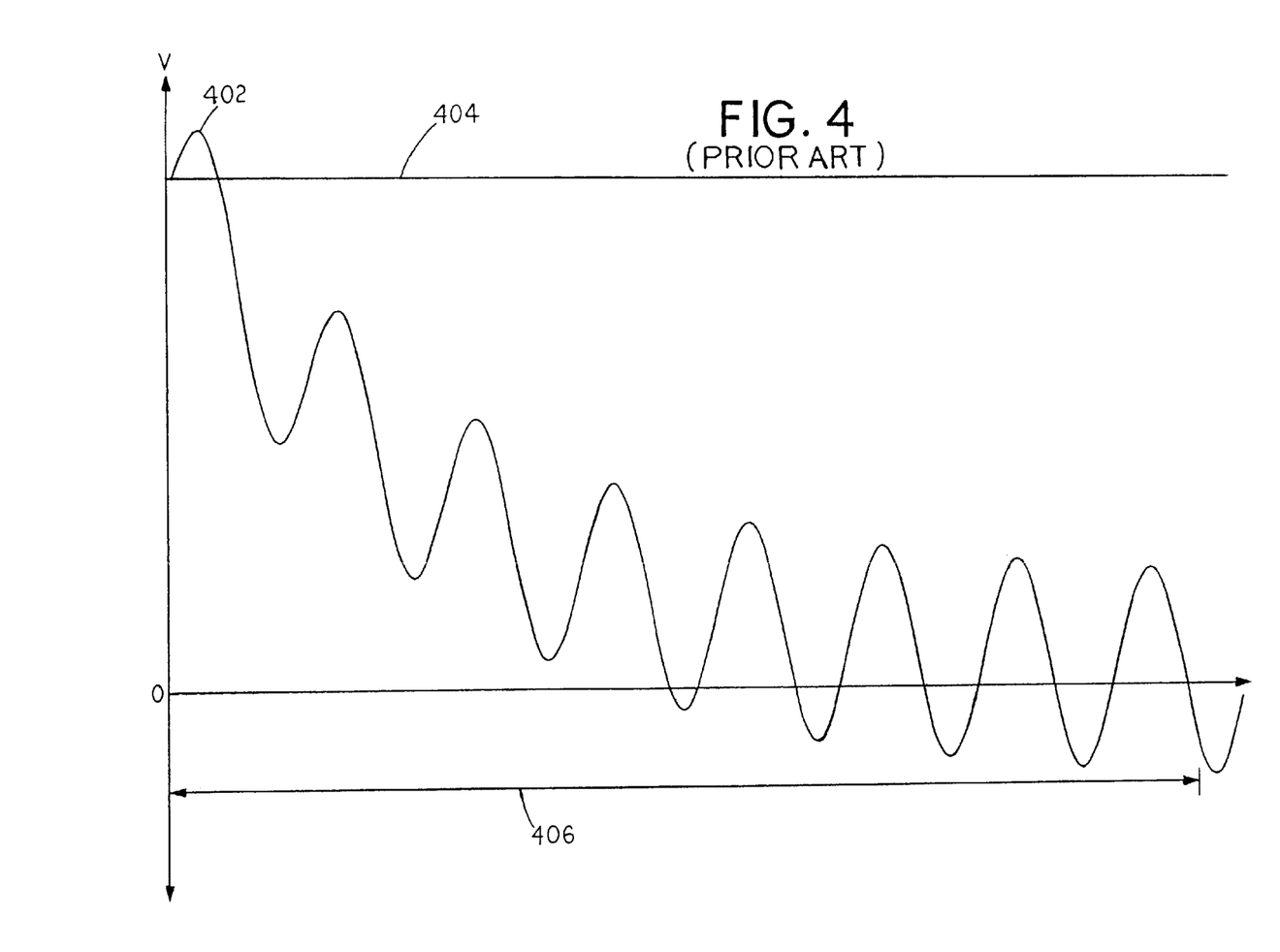

FIG. 2 illustrates a prior art apparatus for performing AC-coupled baseband data slicing. In the present context, the term AC-coupled refers to the fact that only higher frequency components of the baseband signal are compared against the threshold. As shown in FIG. 2, a demodulator 202 using known demodulation techniques outputs a recovered baseband signal. The baseband signal output by the demodulator 202 includes, as is often the case, low frequency components including a DC component or offset. An exemplary baseband signal $V_{in}$ is illustrated in FIG. 3 as a voltage varying over time. For the sake of simplicity, the baseband signal 302 shown in FIG. 3 is represented as a single sinusoidal waveform. In practice, however, such baseband signals typically comprise a plurality of frequency components, resulting in a more complex time domain waveform. As shown, the baseband signal comprises an offset component $V_{DC}$ 304. In an ideal system, the baseband signal is assumed to adhere to a 50% duty cycle. That is, a binary one value (represented, for example, by a positive voltage) has a duration in the time domain baseband signal equal to a binary zero value (represented, for example, by a negative voltage). In order to accurately compare the received baseband signal against a threshold, and still assuming the 50% duty cycle constraint, the AC-coupled data slicer filters out all low frequency components, including the offset $V_{DC}$ using a high pass filter 204. In effect, the high pass filter causes the baseband signal to become centered upon a zero voltage value, rather than a DC offset value. This is illustrated in FIG. 4, where the high pass filtered version of baseband signal 402 is shown over time.

As known in the art, such high pass filters are characterized by a settling time constant which causes DC components in the input signal to be removed from the filter output according to a decaying exponential curve. This effect is illustrated in FIG. 4 where the DC component 404 is gradually removed from the filtered baseband signal 402. Progressively greater attenuating effects by the high pass filter are typically characterized by a correspondingly increased settling time constant that implies, in turn, that the filter output will increasingly lag behind the filter input. As such, filter design must typically strike a balance between the desired attenuation and the settling time constant that the system is able to endure.

Figure 5:
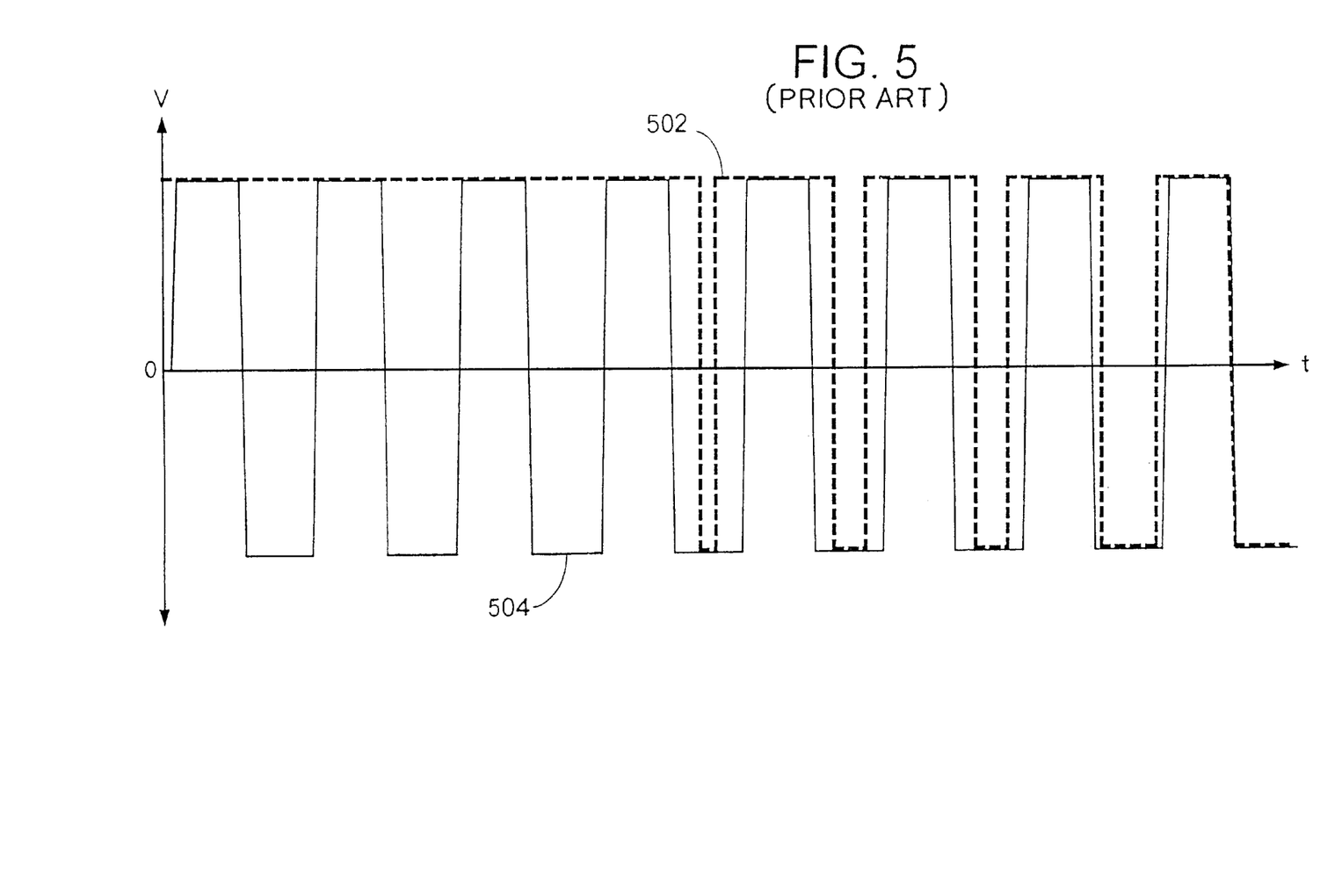

Referring again to FIG. 2, the high pass filtered baseband signal is provided to a comparator 206 that compares the filtered signal against a threshold $V_{th}$. Because the high pass filter 204 has the effect of centering the baseband signal on a zero voltage or ground level, $V_{th}$ is preferably set to that level. Typically, the comparator will output a predetermined positive voltage for any input signal above the threshold and a predetermined negative voltage (of same magnitude) for any input below the threshold. For example, assuming that the filtered baseband signal 402 of FIG. 4 is applied to the comparator of FIG. 2, an exemplary output $V_{out}$ 502 is shown as the heavy dashed line in FIG. 5. Note that the output 502 of the comparator 206 does not accurately track the baseband signal 302 output by the demodulator 202 due to the settling time constant of the high pass filter. In an ideal system, in which the settling time constant where negligible, the output of the comparator 206 would correspond to the curve having reference numeral 504 in FIG. 5. In a typical application, however, a significantly long predetermined delay 406 (typically several times the length of the settling time constant) must pass before the data output of the comparator may be considered reliable. As a result, data may be lost at the beginning of a received signal. To combat this problem, a sufficient amount of dummy data may be inserted as a preamble to the baseband signal being transmitted such that the processing of the dummy data at the receiver allows the predetermined delay to pass before actual baseband data is demodulated and sliced. However, this approach builds in a fixed signal delay that may not be acceptable in all applications. A further difficulty with this approach is that long periods of zeros or ones represented by the baseband signal are seen by the high pass filter as a DC component to be filtered out, thereby attenuating the desired signal, which results in decreased system performance.

Figure 6:
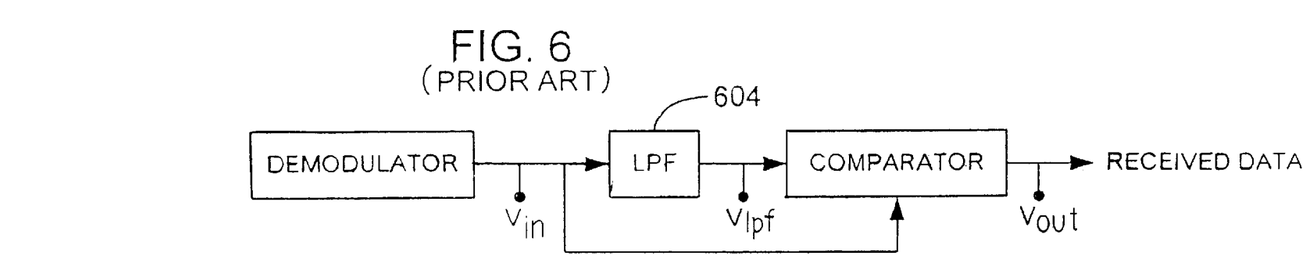
FIG. 6 is a block diagram of an apparatus for performing DC-coupled baseband data slicing in accordance with the prior art.

An alternative to the AC-coupled method is the DC-coupled method of FIG. 6. In this method, an unfiltered version of the received baseband signal is provided to the comparator and a filtered version of the DC offset is provided as the threshold provided to the comparator. In a sense, instead of filtering the baseband signal to the correct threshold level as in the AC-coupled method, the DC-coupled method filters the baseband signal to determine the necessary threshold level. To this end, a low pass filter 604 is used to attenuate all higher frequency components from the baseband signal, preferably leaving only the DC offset to be used as the comparator threshold input. However, as with the high pass filter 204, the low pass filter 604 is characterized by a settling time constant, implying that there is a lag between the time that the DC offset is applied to the low pass filter and the time that it is reflected in the output signal. This is illustrated in FIG. 3 where the output of the low pass filter $V_{lpf}$ 306 is shown as a dotted line. Because of the settling time constant, the output of the comparator in FIG. 6 will be similar to the filtered output 502 shown in FIG. 5. That is, the comparator output will not be reliable until after the predetermined delay has passed. Furthermore, the long strings of ones or zeros in the baseband signal will cause the output of low pass filter 604 to drift, causing a corresponding change in the threshold level. In essence, the DC-coupled approach illustrated in FIG. 6 suffers from the same disadvantages as the AC-coupled approach.

Figure 7:
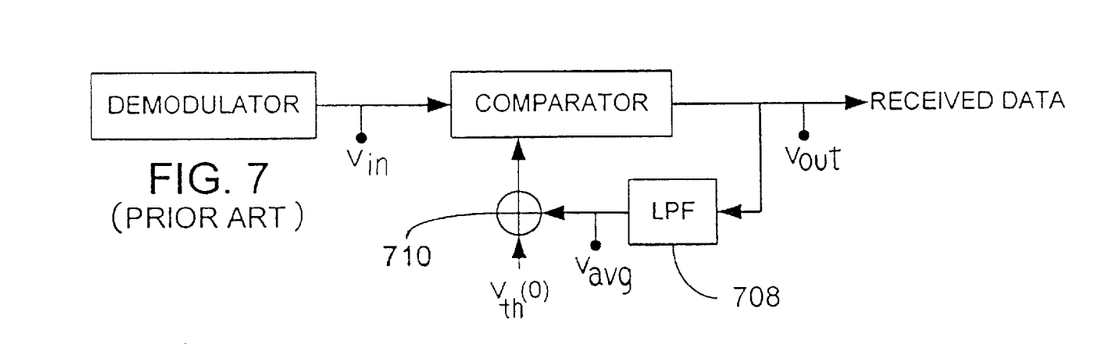
FIG. 7 is a block diagram of an apparatus for performing another form of DC-coupled baseband data slicing in accordance with the prior art.

A variant of the DC-coupled approach is to set the threshold to an initial, predetermined value equal to the expected offset value in the demodulator output, rather than low pass filtering to determine the threshold. This approach suffers, however, in the event that perturbations resulting from the transmission channel or the receiver front-end cause the actual offset value to differ from the assumed offset value, thereby resulting in the use of a non-optimal threshold value. To combat the possible drift of the offset value, yet another approach is to continuously adjust the threshold level as illustrated in FIG. 7.

Figure 8:
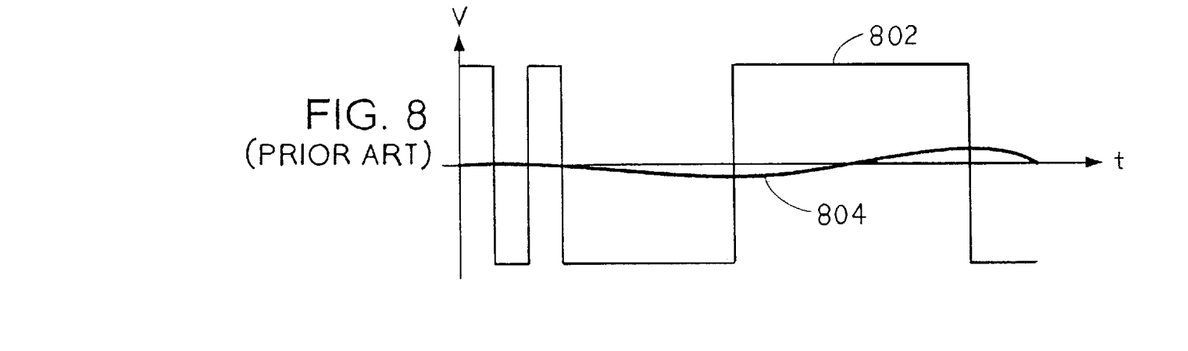
FIG. 8 illustrates exemplary waveforms occurring in the apparatus of FIG. 7.

The threshold is initially set to a predetermined value $V_{th}(0)$. As shown in FIG. 7, the output of the comparator is passed through a low pass filter 708 that has the effect of averaging the duty cycle of the comparator output. If the threshold is, for example, too low, the comparator output will have excessively long high periods, e.g., a duty cycle greater than 50%. The low pass filter will reflect this increase in duty cycle by an increasingly positive output value. This increased low pass filter output is then added to the initial threshold via an adder 710, thereby tending to correct the threshold value. The same process works in the opposite manner when the threshold is too high, resulting in excessively long low periods, e.g., a duty cycle less than 50%. In this case, the output of the low pass filter will become increasingly negative, thereby causing the actual threshold value to be decreased. However, as with the other filter-based approaches discussed above, this method is adversely affected by long strings of binary one and zero values. This is illustrated in FIG. 8 where an exemplary comparator output waveform 802 and the corresponding output 804 from the low pass filter 708 are shown. Note that long strings of binary zero values (shown as negative voltages in the output waveform 802) and binary one values (shown as positive voltages in the output waveform 802) cause the output 804 of the low pass filter 708 to drift. The magnitude of this drift will depend on the actual filter implementation used and the length of the strings of ones and zeros encountered. However, the overall effect of this drift is to cause unnecessary changes to the threshold, thereby degrading system performance.

Thus, a need exists for an improved data slicing technique that decrease the effects of filter settling times typically encountered in AC-coupled and DC-coupled data slicing techniques.

SUMMARY OF THE INVENTION

The present invention provides a technique for data slicing that substantially overcomes the performance degradations caused by filter settling times in prior art techniques. A DC-coupled data slicer and an AC-coupled data slicer are provided, both performing data slicing on a baseband signal based on a variable threshold and a fixed threshold, respectively. The variable threshold is initially set to a stored threshold value, which stored threshold value represents a previously used value of the variable threshold. Differences between DC-coupled sliced data and the AC-coupled sliced data are determined and used to adjust the variable threshold. In a preferred embodiment, a comparator in the form of an exclusive-OR gate is used to determine the differences between the DC-coupled and AC-coupled sliced data to provide a threshold error signal that is, in turn, converted to adjustments providing a threshold correction signal. The AC-coupled data slicer is characterized by a settling time constant. Thus, the variable threshold is not adjusted until expiration of a predetermined delay preferably set to be a multiple of the settling time constant. During pendency of the predetermined delay, the DC-coupled data slicer provides reliable data. After expiry of the predetermined delay, adjustments to the variable threshold are made to correct any detected variances in the expected duty cycle of the DC-coupled data slicer output. In this manner, the present invention overcomes the problems resulting from settling times inherent in prior art techniques.

DETAILED DESCRIPTION OF THE INVENTION

The present invention may be more fully described with reference to FIGS. 9–12. The apparatus illustrated in FIG. 9 comprises a demodulator 902 that provides a baseband signal using known demodulation techniques. As known in the art, the particular demodulation technique used is dependent upon the modulation technique used. For example, where frequency shift keying (FSK) modulation is used, a corresponding FSK demodulator is used; the present invention is not limited in this regard.

Figure 9:
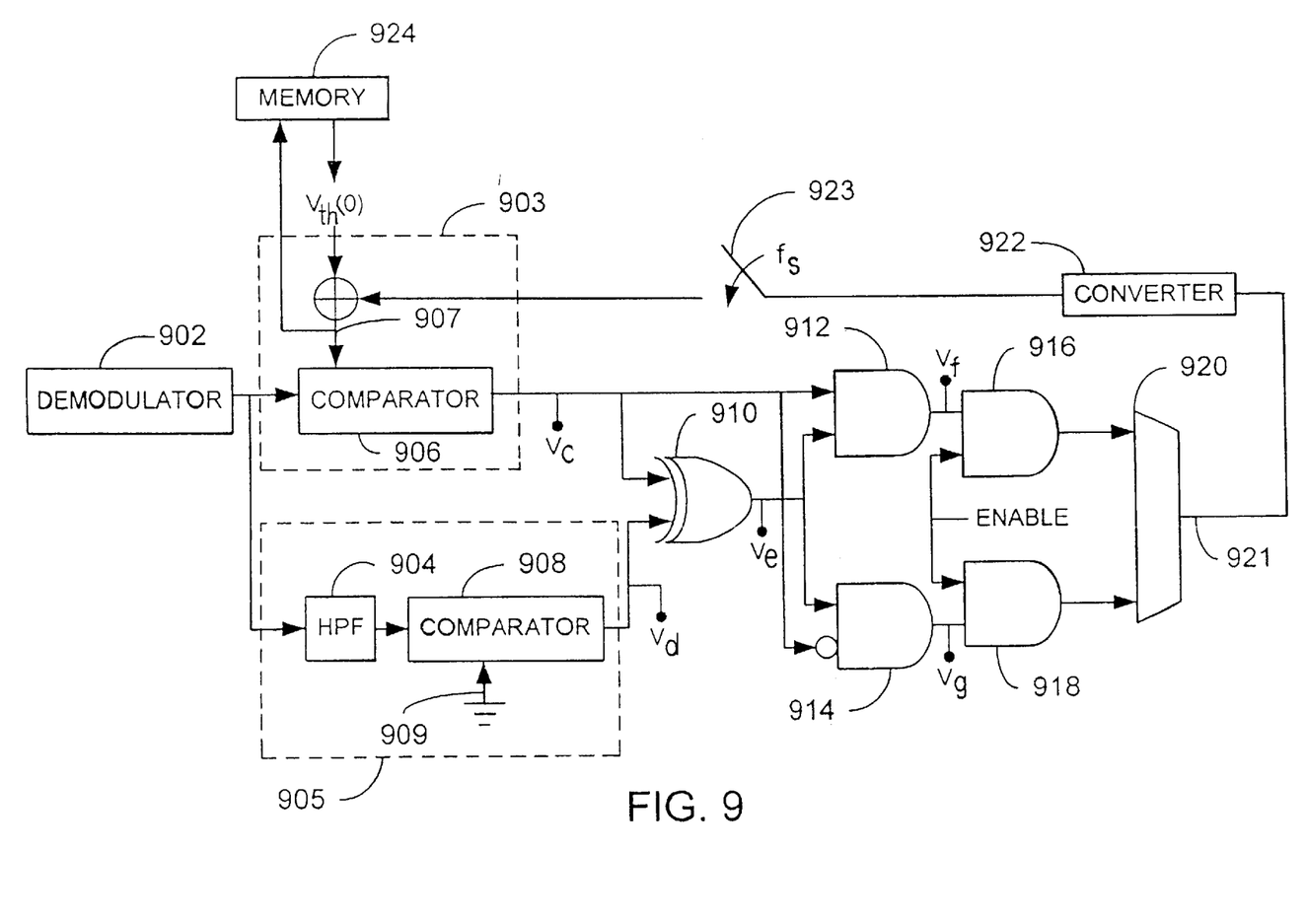
FIG. 9 is a block diagram of an apparatus for performing baseband data slicing in accordance with the present invention.

The output of the demodulator 902 is provided to a DC-coupled data slicer 903 and an AC-coupled data slicer 905. Particular embodiments of the DC- and AC-coupled data slicers 903, 905 are shown in FIG. 9. Both the DC- and AC-coupled data slicers 903, 905 comprise a comparator 906, 908, respectively. In a preferred embodiment, the comparators 906, 908 comprise suitably configured operational amplifiers, as known in the art. Both comparators comprise threshold inputs. In the DC-coupled slicer 903, a variable threshold 907 is provided by the output of an adder 925. As will be described below, the variable threshold 907 is a continuously updated summation of a fixed threshold value—initially set to a previously stored threshold value, $V_{th}(0)$—and a periodically applied threshold correction signal. In contrast, a fixed threshold 909 is applied to the threshold input of the AC-coupled comparator 908. As shown, the fixed threshold 909 is preferably set to the reference point of AC coupling.

The AC-coupled data slicer 905 is further characterized by the presence of a high pass filter 904 used to filter the baseband signal input to the slicer 905. Any of a variety of implementations (e.g., digital or analog filters) may be used to provide the high pass filter as a matter of design choice. In practice, a simple analog high-pass filter of single pole design having a time constant 6.9 times greater than the maximum expected duration of a single baseband state has been shown to provide acceptable results. In practice, the maximum expected duration of a single baseband state is dependent on the type of information being transmitted and is the maximum number of consecutive unchanged bits multiplied times the duration of a single data period. For compressed data, the maximum number of consecutive ones or zeroes is greatly limited and, in one implementation of the present invention, was assumed to be 32 data periods. In the context of the present invention, a data period characterizing a baseband signal is the amount of time used to transmit a signal bit of information. In general, the settling time constant should be longer than the data period of the baseband signal and, in a preferred embodiment, is at least an order of magnitude longer.

The DC-coupled sliced data is output by the DC-coupled slicer 903 and AC-coupled sliced data is output by the AC-coupled slicer 905. The DC-coupled sliced data is considered the received data output of the apparatus. The AC-coupled sliced data is used for comparison against the DC-coupled sliced data in order to determine what corrections, if any, should be made to the variable threshold 907 input to the comparator 906 of the DC-coupled slicer 903.

To this end, a further comparator 910 is provided. The comparator 910 is characterized in that it provides an indication, in the form of a positive voltage output, when its respective inputs are different values, and a zero output when they are the same; hence, a preferred form is an exclusive-OR gate as shown. Thus, the output of the comparator 910 takes the form of an impulse train in which the duration of the respective impulses is proportional to differences between the DC- and AC-coupled sliced data outputs. In particular, the output of the comparator 910 acts as a threshold error signal in that it is indicative of a mismatch between the variable threshold 907 and an otherwise optimal threshold. This is illustrated by way of example in FIGS. 10–12.

Figure 10:
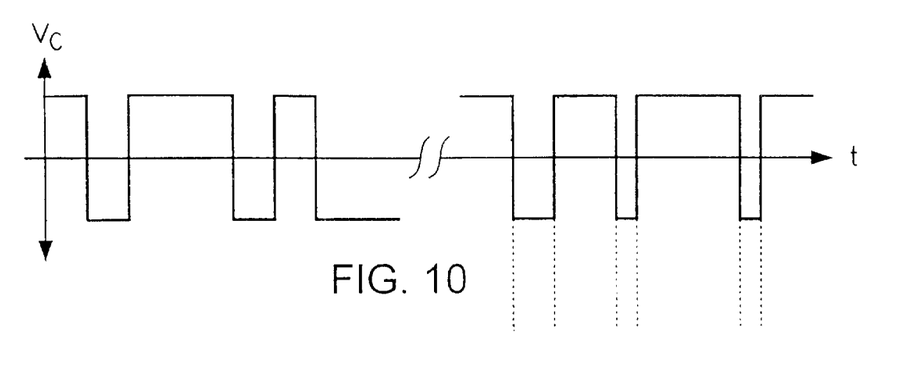
FIGS. 10–12 illustrate exemplary waveforms occurring in the apparatus of FIG. 9.
Figure 11:
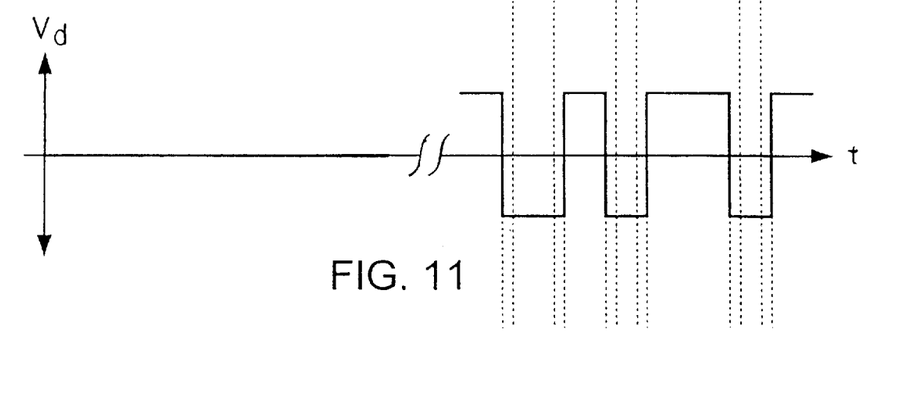
Figure 12:
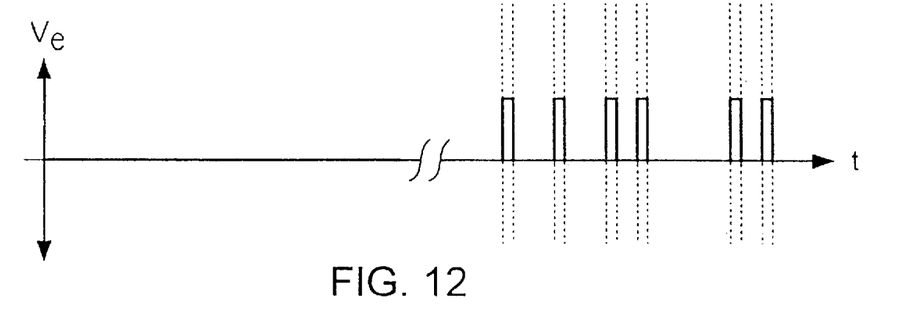

FIG. 10 illustrates an exemplary waveform corresponding to the output ($V_c$) of the DC-coupled data slicer 903. As shown, the DC-coupled output will be initially meaningful presuming that initial threshold value $V_{th}(0)$ is reliable, as shown in FIG. 10. The AC-coupled output ($V_d$) will not be meaningful until after the effects of the settling time constant have passed, as shown in FIG. 11 and described above relative to FIGS. 2–6. In the example shown, FIG. 10 illustrates the condition in which the variable threshold 907 used to determine the latter portion of the DC-coupled output is too low, resulting in a duty cycle greater than 50%. Thus, when compared with the reliable AC-coupled output (provided after the distorting effects of the settling time constant have dissipated), which output is assumed to provide a 50% duty cycle, it is possible to ascertain the precise differences between the DC- and AC-coupled outputs. This is illustrated by the output of the comparator 910 in FIG. 12. As shown, the comparator 910 output ($V_e$) comprises a series of pulses in which the duration of each pulse is representative of the differences between the two waveforms and hence representative of a threshold error signal.

The present invention provides the ability to convert the threshold error signal into a threshold correction signal that may be used to adjust the variable threshold 907. To this end, AND gates 912, 914 are provided. The threshold error signal output by the comparator 910 is provided to an input of each of the AND gates 912, 914. Additionally, the DC-coupled data is provided to a regular input of the first AND gate 912, and to an inverting input of the second AND gate 914. Given this arrangement, when the variable threshold 907 is too low, the output of the first AND gate 912 will track the pulses of the threshold error signal whereas the output of the second AND gate 914 will be zero. Conversely, when the variable threshold 907 is too high, the output of the second AND gate 914 will track the pulses of the threshold error signal whereas the output of the first AND gate 912 will be zero. Of course, in those instances when the DC- and AC-coupled outputs substantially match (i.e., beyond the resolution of the comparator 910), the outputs of both AND gates 912, 914 will be zero. In this manner, the outputs of the AND gates 912, 914 act as mutually exclusive correction signals that may be used to provide adjustments to the variable threshold 907.

As mentioned above, the output of the AC-coupled data slicer is not reliable until after the effects of the settling time constant have passed. In a preferred embodiment, these effects are accounted for by ignoring the output of the AC-coupled slicer 905, and hence the output of the comparator 910 and AND gates 912, 914 until after expiration of a predetermined delay. The predetermine delay is set to be longer than the settling time constant characterizing the high pass filter 904 and, in a preferred embodiment, is set to a multiple of the settling time constant. In practice, a predetermined delay that is 6.9 times the high-pass filter time constant has been found to be acceptable. An exemplary predetermined delay 406 is shown in FIG. 4. The predetermined delay is incorporated into the apparatus of FIG. 9 via a second pair of AND gates 916, 918. In particular, the correction signals output by the first pair of AND gates 912, 914 are gated by an "ENABLE" signal that is asserted only after expiration of the predetermined delay, as determined for example, by a timer circuit, suitably programmed controller or any other means as known in the art. The predetermined delay is initiated each time the demodulator begins providing meaningful output, i.e., at the start of the reception of a compatibly modulated signal.

Once enabled to pass the second pair of AND gates 916, 918, the correction signals are applied to an accumulative device 920. In the embodiment shown, the correction signal passed by the AND gate having reference numeral 916 is an indication that the variable threshold needs to be adjusted upward. In contrast, the correction signal passed by the AND gate having reference numeral 918 is an indication that the variable threshold needs to be adjusted downward. In both correction signals, the number of pulses presented and their respective durations are indications of the amount of adjustments to be applied to the variable threshold 907. The accumulative device 920 is provided to capture the effect of these adjustments.

For example, the accumulative device 920 may comprise an edge-activated up/down counter, an analog integrator with charge pump input, or the like. In the case of an edge-activated up-down counter, a reference sampling clock is used to enable up or down counting. In the case of an analog integrator, the integrator output goes up or down proportionally to the duration of the outputs of AND gates 916, 918 respectively. Regardless of its particular implementation, the accumulative device 920, after expiration of the predetermined delay, responds to each of the correction signals in an incremental fashion and provides a threshold correction signal 922 representative of the cumulative effect of the correction signals. The threshold correction signal 922 is provided in an analog or digital format, depending upon the particular implementation of the accumulative device 920, which format may require conversion by a conversion device 923 (i.e., and analog-to-digital or digital-to-analog converter) before application to the variable threshold 907.

Because the performance of variable threshold 907 is time-variant, the threshold correction signal must be periodically applied to correct the variable threshold. A switch 923 that is periodically closed with sampling frequency $f_s$ represents this operation. The particular sampling frequency used is a matter of design choice and is dependent upon the high-pass filter cutoff frequency. In the implementation of the present invention described above, the sampling frequency is 6.9 times the high-pass filter cutoff frequency. Each time it is sampled, the output of the conversion device 923 is then added by summer 903 to the initial threshold $V_{th}(0)$. The sum is the effective threshold 907 applied to the comparator 906. The initial threshold $V_{th}(0)$ remains unchanged until power-down. On power down, the variable threshold 907 is stored in memory 924 as being representative of a previously good threshold. Upon power-up, the previously good threshold is loaded from non-volatile memory 924 and used as $V_{th}(0)$.

Figure 1:
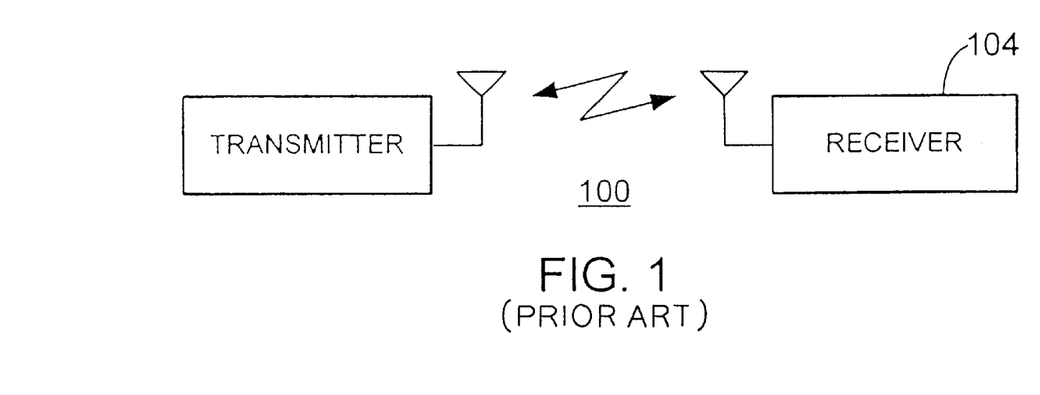
FIG. 1 is a block diagram of a communications system that may benefit from application of the present invention.

In one embodiment, the apparatus of FIG. 9 can be included in a wireless communication system 100 of the type illustrated in FIG. 1, particularly within a receiving unit 104. In a preferred embodiment, the wireless communication system 100 comprises a radio frequency (RF) system operating in the so-called U-NII 5.25–5.35 GHz frequency band. Those having ordinary skill in the art will recognize that the apparatus of FIG. 9 may be included in receiving units in any communication system requiring data slicing operations and that the present invention is not limited in this regard.

What has been described is merely illustrative of the application of the principles of the present invention. Other arrangements and methods can be implemented by those skilled in the art without departing from the spirit and scope of the present invention.

What is claimed is:

1. An apparatus for performing baseband data slicing on a baseband signal, the apparatus comprising:
    a DC-coupled data slicer that performs data slicing, based on a variable threshold, on the baseband signal to provide DC-coupled sliced data; and
    an AC-coupled data slicer that performs data slicing, based on a fixed threshold, on the baseband signal to provide AC-coupled sliced data only after expiration of a settling time constant characterizing the AC-coupled data slicer,
        wherein differences between the DC-coupled sliced data and the AC-coupled sliced data are used to adjust the variable threshold.

2. The apparatus of claim 1, wherein the settling time constant is longer than a data period characterizing the baseband signal.

3. The apparatus of claim 2, wherein the settling time constant is at least an order of magnitude greater than the data period.

4. The apparatus of claim 1, wherein the variable threshold is not adjusted until after a predetermined delay has expired.

5. The apparatus of claim 4, wherein the predetermined delay is a multiple of the settling time constant.

6. A wireless communication unit comprising the apparatus of claim 1.

7. The wireless communication unit of claim 6, further comprising a demodulator to provide the baseband signal.

8. The wireless communication unit of claim 6, further comprising a memory, wherein the variable threshold is stored in memory upon power-down of the wireless communication unit to provide a stored threshold, and wherein the stored threshold is used to initialize the variable threshold upon power-up of the wireless communication unit.

9. An apparatus for determining a threshold error signal based on a baseband signal, the apparatus comprising:
    a DC-coupled data slicer taking the baseband signal and a first data threshold as input and providing a first signal as output;
    an AC-coupled data slicer taking the baseband signal and a second data threshold as input and providing a second signal as output; and
    a comparator that takes the first signal and the second signal as input and provides the threshold error signal as output.

10. The apparatus of claim 9, wherein the AC-coupled data slicer further comprises a high pass filter operating upon the baseband signal, wherein a settling time constant characterizing the high pass filter is longer than a data period characterizing the baseband signal.

11. The apparatus of claim 10, wherein the settling time constant is at least an order of magnitude greater than the data period.

12. The apparatus of claim 9, wherein the comparator comprises an exclusive-OR gate, wherein the threshold error signal is representative of differences between the first signal and the second signal.

13. The apparatus of claim 9, further comprising:
    means for providing a threshold correction signal based on the threshold error signal, wherein the threshold correction signal is applied to correct the first data threshold.

14. The apparatus of claim 13, wherein the threshold correction signal is not provided until after a predetermined delay has expired.

15. The apparatus of claim 14, wherein the predetermined delay is a multiple of a settling time constant characterizing the AC-coupled data slicer.

16. The apparatus of claim 13, wherein the means for providing further comprises:
    a first AND gate that takes the first signal and the threshold error signal as input and provides a first correction signal as output;
    a second AND gate that takes an inverted version of the first signal and the threshold error signal and provides a second correction signal as output,
        wherein the first correction signal is used to apply first adjustments to the threshold correction signal and the second correction signal is used to apply second adjustments opposite the first adjustments to the threshold correction signal.

17. The apparatus of claim 16, wherein the means for providing further comprises:
    means for cumulatively storing the first adjustments and the second adjustments and providing as output the threshold correction signal.

18. A wireless communication unit comprising the apparatus of claim 9.

19. The wireless communication unit of claim 18, further comprising a demodulator to provide the baseband signal.

20. The wireless communication unit of claim 18, further comprising a memory, wherein the first data threshold is stored in memory upon power-down of the wireless communication unit to provide a stored threshold, and wherein the stored threshold is used to initialize the first data threshold upon power-up of the wireless communication unit.

21. In a communication unit, a method for performing baseband data slicing on a baseband signal, the method comprising steps of:

performing DC-coupled data slicing, based on a variable threshold, on the baseband signal to provide DC-coupled sliced data; and performing AC-coupled data slicing, based on a fixed threshold, on the baseband signal to provide AC-coupled sliced data only after expiration of a settling time constant characterizing the AC-coupled data slicing; and adjusting the variable threshold based on differences between the DC-coupled sliced data and the AC-coupled sliced data.

22. The method of claim 21, wherein the settling time constant is longer than a data period characterizing the baseband signal.

23. The method of claim 22, wherein the settling time constant is at least an order of magnitude greater than the data period.

24. The method of claim 21, wherein the step of adjusting is not performed until after a predetermined delay has expired.

25. The method of claim 24, wherein the predetermined delay is a multiple of the settling time constant.

26. The method of claim 21, wherein the communication unit is a wireless communication unit.

27. The method of claim 21, further comprising steps of:

storing the variable threshold in memory upon power-down of the communication unit to provide a stored threshold; and initializing the variable threshold based on the stored threshold upon power-up of the communication unit.

28. In a communication unit, a method for determining a threshold error signal based on a baseband signal, the method comprising steps of:

performing DC-coupled data slicing on the baseband signal based on a first data threshold to provide a first signal;

performing AC-coupled data slicing on the baseband signal based on a second data threshold to provide a second signal; and comparing the first signal and the second signal to provide the threshold error signal.

29. The method of claim 28, the step of performing AC-coupled data slicing further comprises a step of:

high pass filtering the baseband signal, wherein a settling time constant characterizing the high pass filtering is longer than a data period characterizing the baseband signal.

30. The method of claim 29, wherein the settling time constant is at least an order of magnitude greater than the data period.

31. The method of claim 28, wherein the step of comparing further comprises a step of:

performing an exclusive-OR operation upon the first signal and the second signal to provide the threshold error signal.

32. The method of claim 28, further comprising a step of:

providing a threshold correction signal based on the threshold error signal, wherein the threshold correction signal is applied to correct the first data threshold.

33. The method of claim 32, wherein the step of providing the threshold correction signal is not performed until after a predetermined delay has expired.

34. The method of claim 33, wherein the predetermined delay is a multiple of a settling time constant characterizing the step of performing AC-coupled data slicing.

35. The method of claim 32, wherein the step of providing further comprises steps of:

performing first AND operation upon the first signal and the threshold error signal to provide a first correction signal;

performing a second AND operation upon an inverted version of the first signal and the threshold error signal to provide a second correction signal; and applying first adjustments based on the first correction signal and second adjustments based on the second correction signal to the threshold correction signal, wherein the second adjustments are opposite the first adjustments.

36. The method of claim 35, wherein the step of applying the first and second adjustments further comprises steps of:

cumulatively storing the first adjustments and the second adjustments to provide a cumulative adjustment; and providing the cumulative adjustment as the threshold correction signal.

37. The method of claim 28, wherein the communication unit is a wireless communication unit.

38. The method of claim 28, further comprising steps of:

storing the first data threshold in memory upon power-down of the communication unit to provide a stored threshold, and initializing the first data threshold based on the stored threshold upon power-up of the communication unit.

* * * * *

UNITED STATES PATENT AND TRADEMARK OFFICE
CERTIFICATE OF CORRECTION

PATENT NO. : 6,349,121 B1
DATED : February 19, 2002
INVENTOR(S) : Anderson

It is certified that error appears in the above-identified patent and that said Letters Patent is hereby corrected as shown below:

<u>Title page,</u>
Item [73], Assignee information should be replaced with -- MemoryLink Corporation --

Signed and Sealed this

Twenty-ninth Day of October, 2002

Attest:

Attesting Officer

JAMES E. ROGAN
*Director of the United States Patent and Trademark Office*